US008361232B2

United States Patent
Black

(10) Patent No.: US 8,361,232 B2
(45) Date of Patent: Jan. 29, 2013

(54) VAPOR DEPOSITION APPARATUS AND PROCESS FOR CONTINUOUS INDIRECT DEPOSITION OF A THIN FILM LAYER ON A SUBSTRATE

(75) Inventor: Russell Weldon Black, Longmont, CO (US)

(73) Assignee: Primestar Solar, Inc., Arvada, CO (US)

( * ) Notice: Subject to any disclaimer, the term of this patent is extended or adjusted under 35 U.S.C. 154(b) by 278 days.

(21) Appl. No.: 12/770,027

(22) Filed: Apr. 29, 2010

(65) Prior Publication Data

US 2011/0269256 A1    Nov. 3, 2011

(51) Int. Cl.
*H01L 31/18*    (2006.01)
*C23C 16/00*    (2006.01)

(52) U.S. Cl. .......................... 118/726; 118/718; 118/719

(58) Field of Classification Search .................. 118/718, 118/719, 726, 727
See application file for complete search history.

(56) References Cited

U.S. PATENT DOCUMENTS

| | | | |
|---|---|---|---|
| 5,248,349 A | 9/1993 | Foote et al. | |
| 5,304,499 A | 4/1994 | Bonnet et al. | |
| 5,366,764 A | 11/1994 | Sunthankar | |
| 5,712,187 A | 1/1998 | Li et al. | |
| 5,994,642 A | 11/1999 | Higuchi et al. | |
| 6,423,565 B1 | 7/2002 | Barth et al. | |
| 6,444,043 B1 | 9/2002 | Gegenwart et al. | |
| 6,488,985 B1 * | 12/2002 | Honda et al. | 427/248.1 |
| 6,719,848 B2 | 4/2004 | Faykosh et al. | |
| 7,194,197 B1 | 3/2007 | Wendt et al. | |
| 2002/0117199 A1 | 8/2002 | Oswald | |
| 2003/0044539 A1 | 3/2003 | Oswald | |
| 2005/0158891 A1 * | 7/2005 | Barth et al. | 438/22 |
| 2007/0169630 A1 * | 7/2007 | Auyoung | 99/275 |
| 2009/0194165 A1 | 8/2009 | Murphy et al. | |

FOREIGN PATENT DOCUMENTS

| | | |
|---|---|---|
| DE | 102009007587 A1 | 11/2009 |
| EP | 0853345 A1 | 7/1998 |
| EP | 1167566 A1 | 1/2002 |
| WO | 2006/053128 A2 | 5/2006 |

OTHER PUBLICATIONS

EP Search Report issued in connection with corresponding EP Patent Application No. 11163777.3 filed on Apr. 26, 2011.

* cited by examiner

*Primary Examiner* — Parviz Hassanzadeh
*Assistant Examiner* — Nathan K Ford
(74) *Attorney, Agent, or Firm* — Dority & Manning, P.A.

(57) ABSTRACT

An apparatus and related process are provided for vapor deposition of a sublimated source material as a thin film on a photovoltaic (PV) module substrate. A deposition head is configured for sublimating a source material supplied thereto. The sublimated source material condenses onto a transport conveyor disposed below the deposition head. A substrate conveyor is disposed below the transport conveyor and conveys substrates in a conveyance path through the apparatus such that an upper surface of the substrates is opposite from and spaced below a lower leg of the transport conveyor. A heat source is configured adjacent the lower leg of the transport conveyor. The source material plated onto the transport conveyor is sublimated along the lower leg and condenses onto to the upper surface of substrates conveyed by the substrate conveyor.

11 Claims, 5 Drawing Sheets

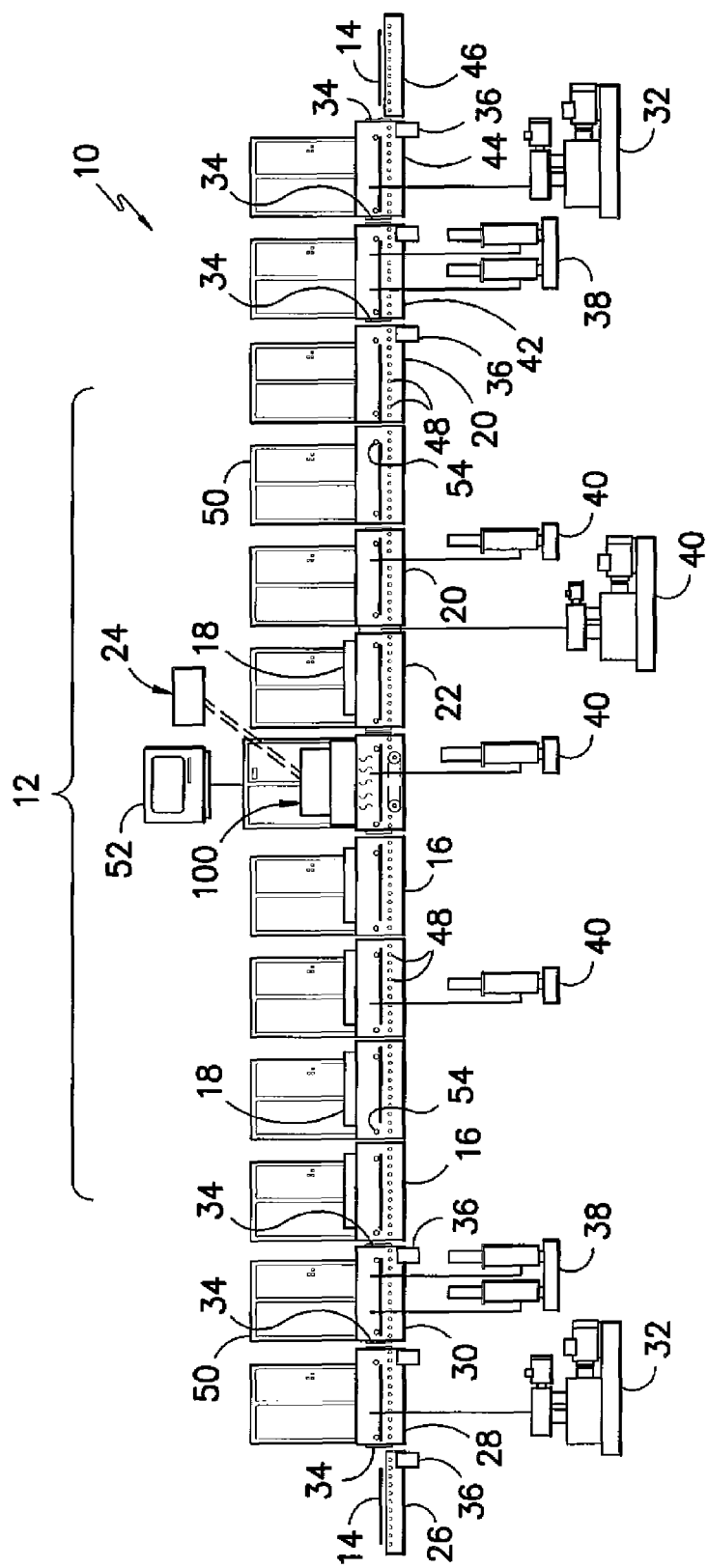
FIG. -1-

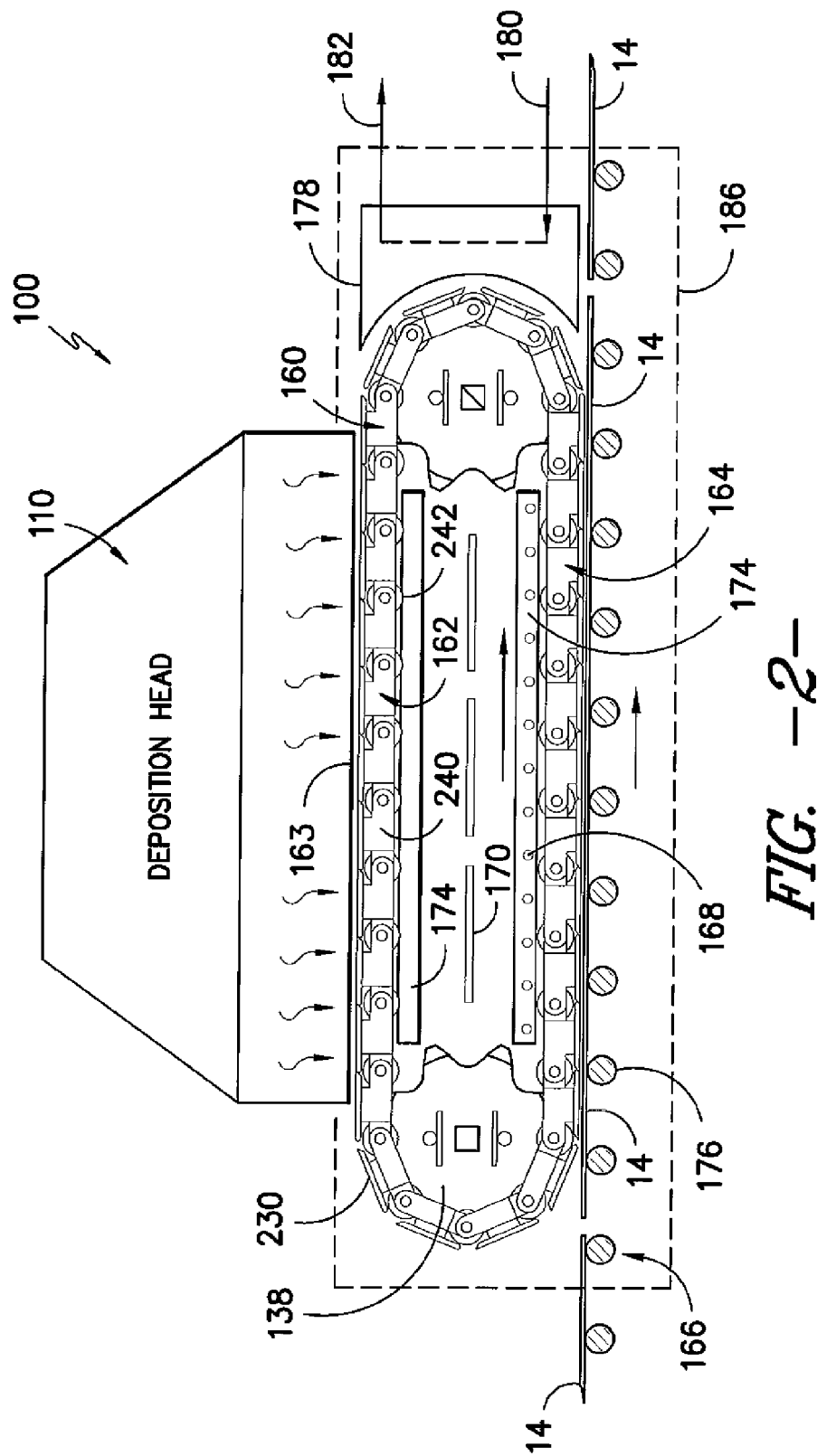
FIG. -2-

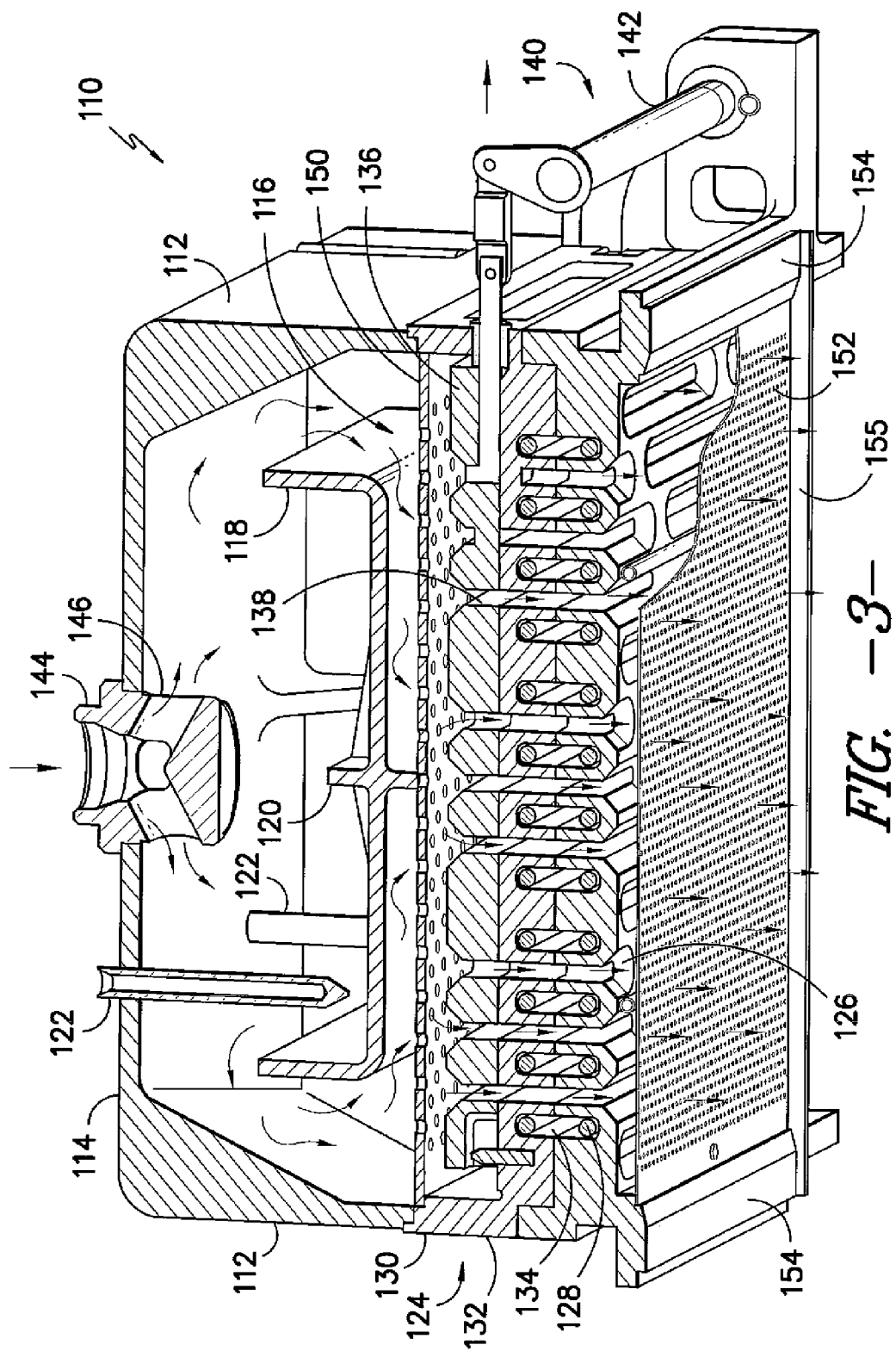
FIG. -3-

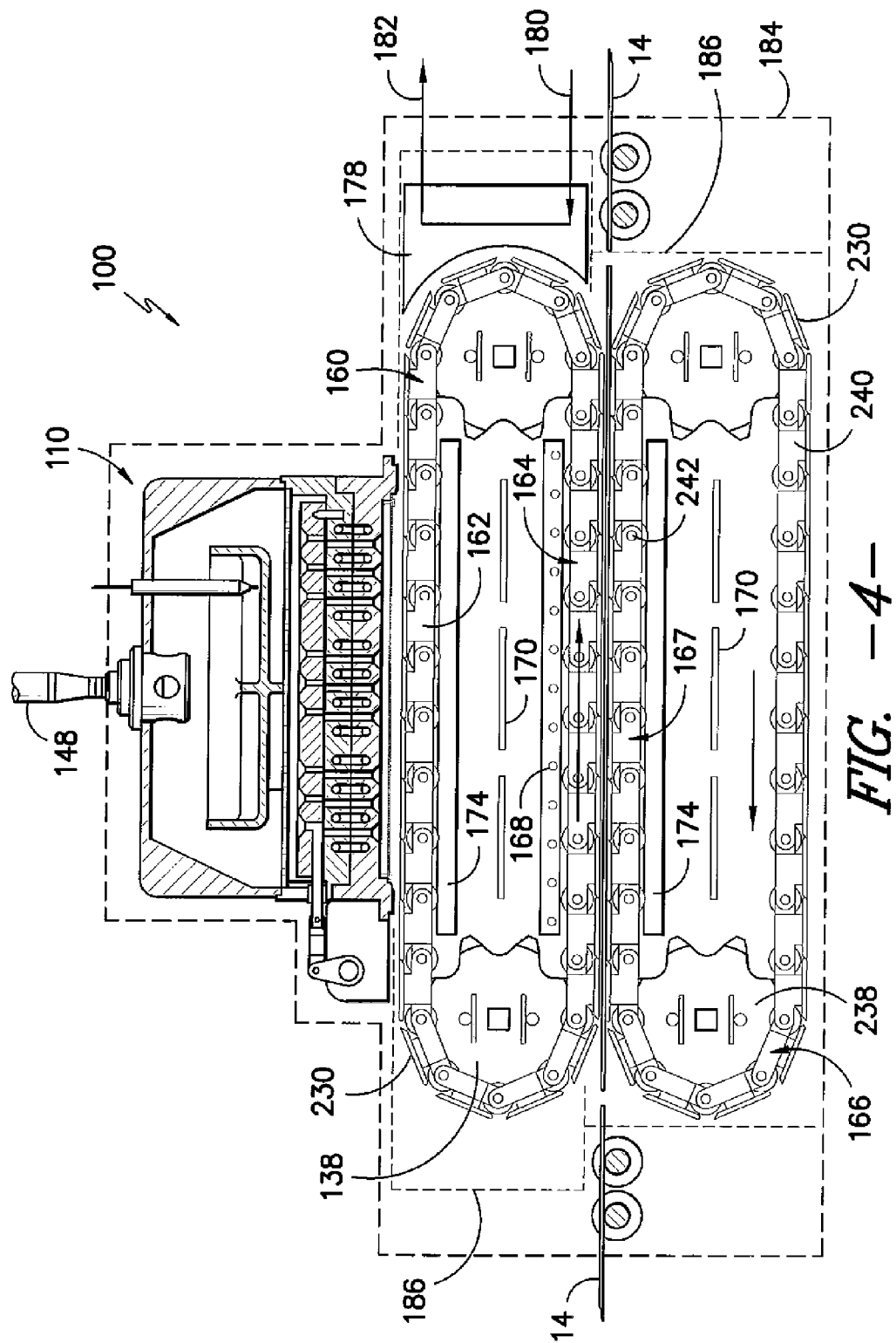
FIG. -4-

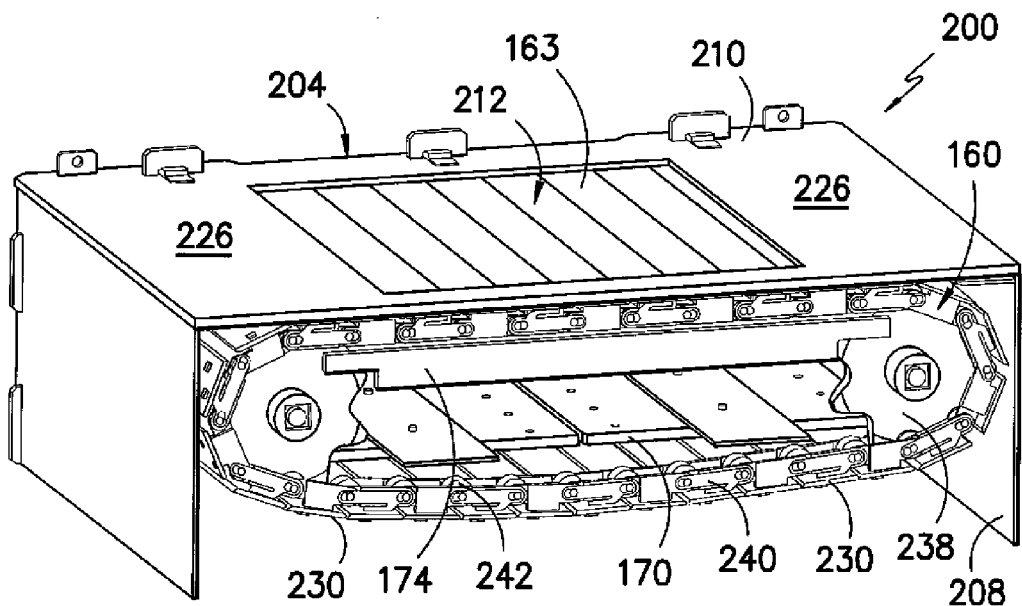
FIG. -5-
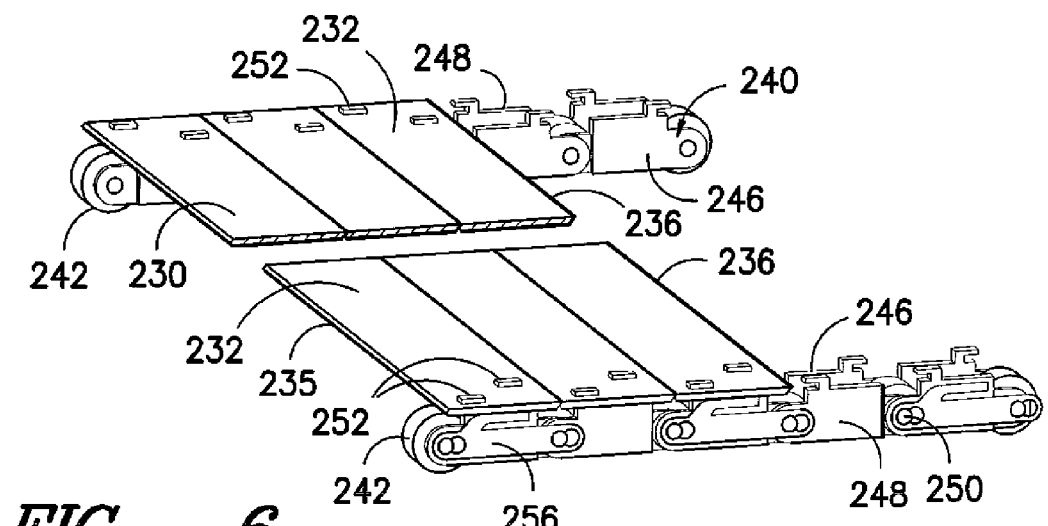
FIG. -6-
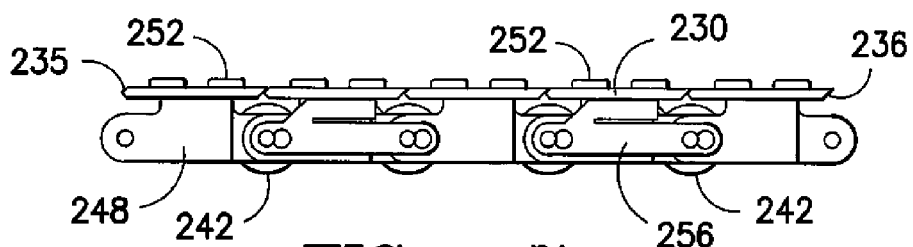
FIG. -7-

VAPOR DEPOSITION APPARATUS AND PROCESS FOR CONTINUOUS INDIRECT DEPOSITION OF A THIN FILM LAYER ON A SUBSTRATE

FIELD OF THE INVENTION

The subject matter disclosed herein relates generally to the field of thin film deposition processes wherein a thin film layer, such as a semiconductor material layer, is deposited on a substrate. More particularly, the subject matter is related to a vapor deposition apparatus and associated process for depositing a thin film layer of a photo-reactive material on a glass substrate in the formation of photovoltaic (PV) modules.

BACKGROUND OF THE INVENTION

Thin film photovoltaic (PV) modules (also referred to as "solar panels") based on cadmium telluride (CdTe) paired with cadmium sulfide (CdS) as the photo-reactive components are gaining wide acceptance and interest in the industry. CdTe is a semiconductor material having characteristics particularly suited for conversion of solar energy (sunlight) to electricity. For example, CdTe has an energy bandgap of 1.45 eV, which enables it to convert more energy from the solar spectrum as compared to lower bandgap (1.1 eV) semiconductor materials historically used in solar cell applications. Also, CdTe converts more efficiently in lower or diffuse light conditions as compared to the lower bandgap materials and, thus, has a longer effective conversion time over the course of a day or in low-light (i.e., cloudy) conditions as compared to other conventional materials.

Solar energy systems using CdTe PV modules are generally recognized as the most cost efficient of the commercially available systems in terms of cost per watt of power generated. However, the advantages of CdTe not withstanding, sustainable commercial exploitation and acceptance of solar power as a supplemental or primary source of industrial or residential power depends on the ability to produce efficient PV modules on a large scale and in a cost effective manner.

Certain factors greatly affect the efficiency of CdTe PV modules in terms of cost and power generation capacity. For example, CdTe is relatively expensive and, thus, efficient utilization (i.e., minimal waste) of the material is a primary cost factor. In addition, the energy conversion efficiency of the module is a factor of certain characteristics of the deposited CdTe film layer. Non-uniformity or defects in the film layer can significantly decrease the output of the module, thereby adding to the cost per unit of power. Also, the ability to process relatively large substrates on an economically sensible commercial scale is a crucial consideration.

CSS (Close Space Sublimation) is a known commercial vapor deposition process for production of CdTe modules. Reference is made, for example, to U.S. Pat. No. 6,444,043 and U.S. Pat. No. 6,423,565. Within the vapor deposition chamber in a CSS system, the substrate is brought to an opposed position at a relatively small distance (i.e., about 2-3 mm) opposite to a CdTe source. The CdTe material sublimes and deposits onto the surface of the substrate. In the CSS system of U.S. Pat. No. 6,444,043 cited above, the CdTe material is in granular form and is held in a heated receptacle within the vapor deposition chamber. The sublimated material moves through holes in a cover placed over the receptacle and deposits onto the stationary glass surface, which is held at the smallest possible distance (1-2 mm) above the cover frame. The cover is heated to a temperature greater than the receptacle.

While there are advantages to the CSS process, the related system is inherently a batch process wherein the glass substrate is indexed into a vapor deposition chamber, held in the chamber for a finite period of time in which the film layer is formed, and subsequently indexed out of the chamber. The system is more suited for batch processing of relatively small surface area substrates. The process must be periodically interrupted in order to replenish the CdTe source, which is detrimental to a large scale production process. In addition, the deposition process cannot readily be stopped and restarted in a controlled manner, resulting in significant non-utilization (i.e., waste) of the CdTe material during the indexing of the substrates into and out of the chamber, and during any steps needed to position the substrate within the chamber.

Accordingly, there exists an ongoing need in the industry for an improved vapor deposition apparatus and process for economically feasible large scale production of efficient PV modules, particularly CdTe modules.

BRIEF DESCRIPTION OF THE INVENTION

Aspects and advantages of the invention will be set forth in part in the following description, or may be obvious from the description, or may be learned through practice of the invention.

In accordance with an embodiment of the invention, an apparatus is provided for indirect vapor deposition of a sublimated source material, such as CdTe, as a thin film on a photovoltaic (PV) module substrate. The deposition process is "indirect" in that the sublimated source material does not plate directly onto the substrate, but is caused to first plate onto a transfer device. The transfer device is then moved to a location opposite to the substrate wherein the plated source material on the transfer device is subsequently sublimated and caused to transfer onto a surface of the substrate. Although the invention is not limited to any particular film thickness, a "thin" film layer is generally recognized in the art as less than 10 microns (μm).

The apparatus includes a deposition head configured for sublimating a source material supplied thereto. The transfer device is disposed relative to the deposition head so that the sublimated source material plates onto the device. In a particular embodiment, the transfer device is configured as a transport conveyor disposed below the deposition head and that moves in an endless loop between an upper leg and a lower leg. The transport conveyor includes an upper surface onto which the sublimated source material plates as the transport conveyor moves in the upper leg. A substrate conveyor is disposed below the transport conveyor and is configured to convey substrates in a conveyance path through the apparatus such that an upper surface of the substrates is opposite from and spaced below the lower leg of the transport conveyor. A heat source is configured at an effective location adjacent the lower leg of the transport conveyor to cause the source material that plated onto the transport conveyor along the upper leg to sublimate along the lower leg. The sublimated source material transfers to the upper surface of substrates conveyed by the substrate conveyor.

Variations and modifications to the embodiment of the vapor deposition apparatus discussed above are within the scope and spirit of the invention and may be further described herein.

In still another aspect, the invention encompasses a process for indirect vapor deposition of a sublimated source material, such as CdTe, as a thin film on a photovoltaic (PV) module substrate. The process includes sublimating source material in a deposition head, which plates onto a transfer device that is disposed relative to the deposition head for this purpose. Although not limited to this, the transfer device may be a first ("transport") conveyor that moves to a position adjacent to a second ("substrate") conveyor, which carries a substrate thereon. The source material on the first conveyor is then sublimated and transfers (plates) to an upper surface of the substrate carried by the second conveyor.

Variations and modifications to the embodiment of the vapor deposition process discussed above are within the scope and spirit of the invention and may be further described herein.

These and other features, aspects, and advantages of the present invention will become better understood with reference to the following description and appended claims, or may be obvious from the description or claims, or may be learned through practice of the invention.

BRIEF DESCRIPTION OF THE DRAWING

A full and enabling disclosure of the present invention, including the best mode thereof, is set forth in the specification, which makes reference to the appended drawings, in which:

FIG. 1 is a plan view of a system that may incorporate embodiments of a vapor deposition apparatus of the present invention;

FIG. 2 is a cross-sectional and partial plan view of an embodiment of a vapor deposition apparatus according to aspects of the invention;

FIG. 3 is a cross-sectional and perspective view of an embodiment of a deposition head;

FIG. 4 is a cross-sectional view of an alternative embodiment of a vapor deposition apparatus;

FIG. 5 is perspective view of an embodiment of an upper conveyor assembly that may be used in a vapor deposition apparatus in accordance with aspects of the invention;

FIG. 6 is a perspective view of an embodiment of a conveyor assembly; and,

FIG. 7 is a side view of the conveyor assembly of FIG. 6.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment, can be used with another embodiment to yield a still further embodiment. Thus, it is intended that the present invention encompass such modifications and variations as come within the scope of the appended claims and their equivalents.

FIG. 1 illustrates an embodiment of a system 10 that may incorporate a vapor deposition apparatus 100 (FIGS. 2 through 4) in accordance with embodiments of the invention configured for deposition of a thin film layer on a photovoltaic (PV) module substrate 14 (referred to hereafter as a "substrate"). The thin film may be, for example, a film layer of cadmium telluride (CdTe). As mentioned, it is generally recognized in the art that a "thin" film layer on a PV module substrate is generally less than about 10 microns (μm), although the invention is not limited to any particular thickness. It should be appreciated that the present vapor deposition apparatus 100 is not limited to use in the system 10 illustrated in FIG. 1, but may be incorporated into any suitable processing line configured for vapor deposition of a thin film layer onto a PV module substrate 14.

For reference and an understanding of an environment in which the vapor deposition apparatus 100 may be used, the system 10 of FIG. 1 is described below, followed by a detailed description of the apparatus 100.

Referring to FIG. 1, the exemplary system 10 includes a vacuum chamber 12 defined by a plurality of interconnected modules, including a plurality of heater modules 16 that define a pre-heat section of the vacuum chamber 12 through which the substrates 14 are conveyed and heated to a desired temperature before being conveyed into the vapor deposition apparatus 100. Each of the modules 16 may include a plurality of independently controlled heaters 18, with the heaters defining a plurality of different heat zones. A particular heat zone may include more than one heater 18.

The vacuum chamber 12 also includes a plurality of interconnected cool-down modules 20 downstream of the vapor deposition apparatus 100. The cool-down modules 20 define a cool-down section within the vacuum chamber 12 through which the substrates 14 having the thin film of sublimated source material deposited thereon are conveyed and cooled at a controlled cool-down rate prior to the substrates 14 being removed from the system 10. Each of the modules 20 may include a forced cooling system wherein a cooling medium, such as chilled water, refrigerant, gas, or other medium, is pumped through cooling coils (not illustrated) configured with the modules 20.

In the illustrated embodiment of system 10, at least one post-heat module 22 is located immediately downstream of the vapor deposition apparatus 100 and upstream of the cool-down modules 20 in a conveyance direction of the substrates. As the leading section of a substrate 14 is conveyed out of the vapor deposition apparatus 100, it moves into the post-heat module 22, which maintains the temperature of the substrate 14 at essentially the same temperature as the trailing portion of the substrate still within the vapor deposition apparatus 100. In this way, the leading section of the substrate 14 is not allowed to cool while the trailing section is still within the vapor deposition apparatus 100. If the leading section of a substrate 14 were allowed to cool as it exited the apparatus 100, a non-uniform temperature profile would be generated longitudinally along the substrate 14. This condition could result in breaking, cracking, or warping of the substrate from thermal stress.

As diagrammatically illustrated in FIG. 1, a feed device 24 is configured with the vapor deposition apparatus 100 to supply source material, such as granular CdTe. The feed device 24 may take on various configurations within the scope and spirit of the invention, and functions to supply the source material without interrupting the continuous vapor deposition process within the apparatus 100 or conveyance of the substrates 14 through the apparatus 100.

Still referring to FIG. 1, the individual substrates 14 are initially placed onto a load conveyor 26, and are subsequently moved into an entry vacuum lock station that includes a load module 28 and a buffer module 30. A "rough" (i.e., initial) vacuum pump 32 is configured with the load module 28 to drawn an initial vacuum, and a "high" or "fine" vacuum pump 38 is configured with the buffer module 30 to increase the vacuum in the buffer module 30 to essentially the vacuum pressure within the vacuum chamber 12. Valves 34 (e.g., gate-type slit valves or rotary-type flapper valves) are operably disposed between the load conveyor 26 and the load module 28, between the load module 28 and the buffer module 30, and between the buffer module 30 and the vacuum chamber 12. These valves 34 are sequentially actuated by a motor or other type of actuating mechanism 36 in order to introduce the substrates 14 into the vacuum chamber 12 in a step-wise manner without affecting the vacuum within the chamber 12.

In operation of the system 10, an operational vacuum is maintained in the vacuum chamber 12 by way of any combination of rough and/or high vacuum pumps 40. In order to introduce a substrate 14 into the vacuum chamber 12, the load module 28 and buffer module 30 are initially vented (with the valve 34 between the two modules in the open position). The valve 34 between the buffer module 30 and the first heater module 16 is closed. The valve 34 between the load module 28 and load conveyor 26 is opened and a substrate 14 is moved into the load module 28. At this point, the first valve 34 is shut and the rough vacuum pump 32 then draws an initial vacuum in the load module 28 and buffer module 30. The substrate 14 is then conveyed into the buffer module 30, and the valve 34 between the load module 28 and buffer module 30 is closed. The high vacuum pump 38 then increases the vacuum in the buffer module 30 to approximately the same vacuum in the vacuum chamber 12. At this point, the valve 34 between the buffer module 30 and vacuum chamber 12 is opened and the substrate 14 is conveyed into the first heater module 16.

An exit vacuum lock station is configured downstream of the last cool-down module 20, and operates essentially in reverse of the entry vacuum lock station described above. For example, the exit vacuum lock station may include an exit buffer module 42 and a downstream exit lock module 44. Sequentially operated valves 34 are disposed between the buffer module 42 and the last one of the cool-down modules 20, between the buffer module 42 and the exit lock module 44, and between the exit lock module 44 and an exit conveyor 46. A high vacuum pump 38 is configured with the exit buffer module 42, and a rough vacuum pump 32 is configured with the exit lock module 44. The pumps 32, 38 and valves 34 are sequentially operated to move the substrates 14 out of the vacuum chamber 12 in a step-wise fashion without loss of vacuum condition within the vacuum chamber 12.

System 10 also includes a conveyor system configured to move the substrates 14 into, through, and out of the vacuum chamber 12. In the illustrated embodiment, this conveyor system includes a plurality of individually controlled conveyors 48, with each of the various modules including a respective one of the conveyors 48. It should be appreciated that the type or configuration of the conveyors 48 may vary. In the illustrated embodiment, the conveyors 48 are roller conveyors having rotatably driven rollers that are controlled so as to achieve a desired conveyance rate of the substrates 14 through the respective module and the system 10 overall.

As described, each of the various modules and respective conveyors in the system 10 are independently controlled to perform a particular function. For such control, each of the individual modules may have an associated independent controller 50 configured therewith to control the individual functions of the respective module. The plurality of controllers 50 may, in turn, be in communication with a central system controller 52, as diagrammatically illustrated in FIG. 1. The central system controller 52 can monitor and control (via the independent controllers 50) the functions of any one of the modules so as to achieve an overall desired heat-up rate, deposition rate, cool-down rate, conveyance rate, and so forth, in processing of the substrates 14 through the system 10.

Referring to FIG. 1, for independent control of the individual respective conveyors 48, each of the modules may include any manner of active or passive sensors 54 that detect the presence of the substrates 14 as they are conveyed through the module. The sensors 54 are in communication with the respective module controller 50, which is in turn in communication with the central controller 52. In this manner, the individual respective conveyor 48 may be controlled to ensure that a proper spacing between the substrates 14 is maintained and that the substrates 14 are conveyed at the desired conveyance rate through the vacuum chamber 12.

FIGS. 2 through 7 relate to aspects of particular embodiments of a vapor deposition apparatus 100 in accordance with aspects of the invention. Referring to FIG. 2, the apparatus 100 includes a deposition head 110 that is configured for sublimating a source material, such as CdTe, supplied thereto. The deposition head 110 is depicted schematically in FIG. 2, and it should be understood that the apparatus is not limited to any particular configuration of deposition head 110 or deposition process. A particular embodiment of a deposition head 110 is illustrated in FIG. 3 and described in greater detail below. A transfer device is disposed below the deposition head 110 and provides a surface onto which the sublimated source material plates. The transfer device then moves to a position wherein the source material plated thereon is re-sublimated and plates onto a substrate 14. The transfer device may take on various configurations within the scope and spirit of the invention, and may be any device or mechanism that is suitable for transferring sublimated source material to a substrate in an indirect deposition process, as described herein.

In a particular embodiment described herein, the transfer device is configured as a conveyor 160 that moves in an endless loop around sprockets 238 (with at least one sprocket 238 being a drive sprocket) between an upper leg 162 and a lower leg 164. The upper leg 162 is the horizontal portion of the conveyor 160 opposite from the deposition head 110. As the conveyor 160 moves along the upper leg 162, sublimated source material from the deposition head 110 condenses (plates) onto the upper surface 163 of the conveyor 160. As the conveyor 160 continues in its endless loop path, the upper surface 163 (with source material plated thereon) moves along the lower leg 164, as indicated by the arrows in FIG. 2. The lower leg 164 is the horizontal portion of the endless loop path that is moving in the opposite direction from the horizontal upper leg 162.

A substrate conveyor 166 is disposed below the transport conveyor 160, in particular below the lower leg 164. The substrate conveyor 166 is configured to convey substrates 14 in a conveyance path through the vapor deposition apparatus 100 such that an upper surface of the substrates 14 is opposite from and spaced below the lower leg 164 of the transport conveyor 160. The distance between the upper surface of the substrate 14 and the surface 163 of the conveyor 160 is referred to as a diffusion length, and is the distance sublimated source material (from the surface 163) must travel prior to condensing onto the upper surface of the substrate 14. The substrate conveyor 166 moves the substrates 14 along a conveyance path that ensures a uniform, constant diffusion length through the apparatus 100.

The transport conveyor 160 and substrate conveyor 166 may be configured within any manner of housing structure 186, with the deposition head 110 configured above the housing structure 186.

To maintain a precise horizontal aspect of the transport conveyor 160 along the upper leg 162 and lower leg 164, any manner of track structure 174 may be utilized to engage the conveyor 160 along the respective legs. In the illustrated embodiment, the conveyor 160 includes rollers 142 that engage and roll along the tracks 174, as explained in greater detail below.

A heat source 168 is configured adjacent to the lower leg 164 of the transport conveyor 160 and generates heat effective for sublimating the source material that plated onto the upper surface 163 of the transport conveyor 160 along the upper leg 162 of the conveyor path. In the illustrated embodiment, the heat source 168 includes a plurality of heater elements that extend transversely across the width of the conveyor 160 and spaced apart along the lower leg 164 within the conveyor loop such that the upper surface 163 is heated indirectly along the lower leg 164 by heating of the underside (inner) surface of the conveyor 160. The pattern, number, spacing, and so forth, of the heater elements is designed to ensure an even heating of the upper surface 163 along the lower leg 164. As the source material sublimates, it diffuses and plates onto the underlying upper surface of the substrate 14 that is moving along the conveyance path parallel to the lower leg 164. The diffusion length may be, for example, within a range of about 2 mm to about 50 mm. The surface of the substrate 14 is at a temperature such that the sublimated source material diffuses across the relatively short diffusion length and immediately plates on the substrate 14 as a thin film layer of the source material. Desirably, there is no intervening structure between the upper surface of a substrate 14 carried by the substrate conveyor 166 and the lower leg 164 of the transport conveyor 166 that would inhibit this process by, for example, increasing the diffusion length or presenting other structure on which the sublimated source material may condense on.

A cooling unit 178 is disposed in the endless loop path of the transport conveyor 160 after the location where the source material is sublimated from the conveyor and prior to the conveyor 160 returning to its upper leg 162. In the illustrated embodiments, the cooling unit 178 is configured adjacent to a sprocket 238 around which the conveyor 160 runs as the conveyor transitions from the lower leg 164 to the upper leg 162. This cooling unit 178 serves to return the upper surface 163 of the conveyor 160 to a temperature that is effective for causing the sublimated source material from the deposition head 110 to plate onto the surface 163 as the conveyor runs along the upper leg 162. The cooling unit 178 may be configured as any type of suitable heat exchanger, and may be supplied with a recirculating cooling medium through inlet supply line 180 and outline line 182. The cooling medium may be, for example, refrigerant, chilled water, gas, or any other type of suitable medium.

FIG. 2 also depicts thermal shielding 170 disposed to generally isolate the thermal conditions between the upper leg 162 and lower leg 164. It should be appreciated that any manner and configuration of shielding 170 may be utilized to effectuate the desired various thermal conditions within the apparatus 100 between, for example, the upper leg 162 and lower leg 164 of the transport conveyor 160. Similarly, in the embodiment of FIG. 4 discussed below wherein the substrate conveyor 166 is also an endless loop-type conveyor, shielding 170 may be utilized between the upper leg that conveys the substrates adjacent to the lower leg 164 of the transport conveyor and the lower return leg.

In the embodiment of FIG. 2, the substrate conveyor 166 moves in the same direction as the transport conveyor 160 along the lower leg 164. The linear speeds of the conveyors 160, 166 may be matched along the lower leg 164 such that relative movement between the conveyors is essentially eliminated during the sublimation and deposition process. In an alternate embodiment, the substrate conveyor 166 may move in a direction opposite to the transport conveyor 160 along the lower leg 164.

It should be appreciated that the type of conveyor configuration used for the transport conveyor 160 and substrate conveyor 166 may vary widely within the scope and spirit of the invention. In the embodiment of FIG. 2, the transport conveyor 160 comprises a plurality of slats 230 interconnected by link assemblies 240, as discussed in greater detail below with respect to FIGS. 5 through 7. The slats 230 each have respective flat planar outer surfaces that collectively define the upper surface 163 along the upper leg 162. The link assemblies 240 include the rollers 242 that engage the tracks 174 along the upper leg 162 and lower leg 164, and engage drive cogs on the sprockets 238. In this embodiment, the substrate conveyor 166 is defined by a plurality of spaced apart elongated rollers 176, with at least certain of the rollers 176 being driven to convey the substrates 14 through the apparatus 100 at a desired conveyance rate.

FIG. 4 illustrates an embodiment wherein the apparatus 100 is modular and contained within a casing structure 184. This configuration is particularly suited as a modular component of the system 10 of FIG. 1, for example. The transport conveyor 160 in this embodiment may be as described above with respect to the embodiment of FIG. 2. The substrate conveyor 166 may also be configured as an endless loop conveyor that moves around sprockets 238 similar to the transport conveyor 160, and include an upper leg 167 that defines the conveyance path for substrates 14 through the apparatus 100. As with the transport conveyor 160, this endless loop conveyor 166 may include a plurality of interconnected slats 230, with each of the slats 230 having a respective flat planar outer surface that lie in a common horizontal plane in the upper leg 167 and define an uninterrupted flat support surface for the substrates 14. The slats 230 may be interconnected by link assemblies 240 at opposite longitudinal ends of the slats 230. The link assemblies 240 include rollers 242 configured therewith that engage tracks 174 disposed along the upper leg 167 of the conveyance path.

FIG. 3 illustrates a particular embodiment of a deposition head 110 that may be utilized with the present invention. A receptacle 116 is disposed within an interior space and is configured for receipt of a granular source material (not shown). As mentioned, the granular source material may be supplied by a feed device or system 24 (FIG. 1) via a feed tube 148 (FIG. 4). The feed tube 148 is connected to a distributor 144 disposed in an opening in a top wall 114 of the deposition head 110. The distributor 144 includes a plurality of discharge ports 146 that are configured to evenly distribute the granular source material into the receptacle 116. The receptacle 116 has an open top and may include any configuration of internal ribs 120 or other structural elements.

In the illustrated embodiment, at least one thermocouple 122 is operationally disposed through the top wall 114 of the deposition head 110 to monitor temperature within the deposition head 110 adjacent to or in the receptacle 116.

The deposition head 110 also includes side walls and longitudinal end walls 112. The receptacle 116 has a shape and configuration such that the end walls 118 are spaced from the end walls 112 of the head chamber 110. Very little clearance exists between the side walls of the receptacle 116 and side walls of the deposition head 110. With this configuration, sublimated source material will flow out of the open top of the receptacle 116 and downwardly over the end walls 118 as leading and trailing curtains of vapor over, as depicted by the flow arrows in FIG. 3. Very little of the sublimated source material will flow over the side walls of the receptacle 116.

A heated distribution manifold 124 is disposed below the receptacle 116. This distribution manifold 124 may take on various configurations within the scope and spirit of the invention, and serves to indirectly heat the receptacle 116, as well as to distribute the sublimated source material that flows from the receptacle 116. In the illustrated embodiment, the heated distribution manifold 124 has a clam-shell configuration that includes an upper shell member 130 and a lower shell member 132. Each of the shell members 130, 132 includes recesses therein that define cavities 134 when the shell members are mated together as depicted in FIG. 3. Heater elements 128 are disposed within the cavities 134 and serve to heat the distribution manifold 124 to a degree sufficient for indirectly heating the source material within the receptacle 116 to cause sublimation of the source material. The heater elements 128 may be made of a material that reacts with the source material vapor and, in this regard, the shell members 130, 132 also serve to isolate the heater elements 128 from contact with the source material vapor. The heat generated by the distribution manifold 124 is also sufficient to prevent the sublimated source material from plating out onto components of the deposition head 110. Desirably, the coolest component in the deposition head 110 is the upper surface 163 of the underlying transport conveyor 160 so as to ensure that the sublimated source material plates onto the conveyor 160 and not onto other components of the deposition head 110.

Still referring to FIG. 3, the heated distribution manifold 124 includes a plurality of passages 126 defined therethrough. These passages have a shape and configuration so as to uniformly distribute the sublimated source material towards the underlying transport conveyor 160.

In the illustrated embodiment, a distribution plate 152 is disposed below the distribution manifold 124 at a defined distance above a horizontal plane of the upper surface 163 of the underlying conveyor 160 (FIG. 2). The distribution plate 152 includes a pattern of passages, such as holes, slits, and the like, therethrough that further distribute the sublimated source material passing through the distribution manifold 124 such that the source material vapors are uninterrupted in the transverse direction. In other words, the pattern of passages are shaped and staggered or otherwise positioned to ensure that the sublimated source material is deposited completely over the upper surface 163 of the conveyor 160 in the transverse direction so that longitudinal streaks or stripes of "uncoated" regions on the upper surface 163 are avoided.

As previously mentioned, a significant portion of the sublimated source material will flow out of the receptacle 116 as leading and trailing curtains of vapor, as depicted by the arrows flowing over the edges 118 in FIG. 3. Although these curtains of vapor will diffuse to some extent in the longitudinal direction prior to passing through the distribution plate 152, it should be appreciated that it is unlikely that a uniform distribution of the sublimated source material in the longitudinal direction will be achieved. In other words, more of the sublimated source material will be distributed through the longitudinal end sections of the distribution plate 152 as compared to the middle portion of the distribution plate. However, because the transport conveyor 160 moves within the vapor deposition apparatus 100 at a constant (non-stop) linear speed, the upper surface 163 of the conveyor 160 will be exposed to the same deposition environment regardless of any non-uniformity of the vapor distribution along the longitudinal aspect of the apparatus 100. The passages 126 in the distribution manifold 124 and the holes in the distribution plate 152 ensure a relatively uniform distribution of the sublimated source material in the transverse aspect of the vapor deposition apparatus 100. So long as the uniform transverse aspect of the vapor is maintained, a relatively uniform thin film layer is deposited onto the upper surface 163 of the conveyor 160 regardless of any non-uniformity in the vapor deposition along the longitudinal aspect of the apparatus 100.

As illustrated in the figures, it may be desired to include a debris shield 150 between the receptacle 116 and the distribution manifold 124. This shield 150 includes holes defined therethrough (which may be larger or smaller than the size of the holes of the distribution plate 152) and primarily serves to retain any granular or particulate source material from passing through and potentially interfering with operation of the movable components of the distribution manifold 124. In other words, the debris shield 150 can be configured to act as a breathable screen that inhibits the passage of particles without substantially interfering with vapors flowing through the shield 150.

Referring to FIG. 3, the apparatus desirably includes transversely extending seals 154 at each longitudinal end of the deposition head 110. The seals 154 may engage against structure of the underlying transport conveyor 160 assembly, such as a top member 226 that defines an open deposition area 212, as discussed in greater detail below with respect to FIG. 5. The seals 154 help to maintain the sublimated source material in the deposition area above the upper surface 163 of the conveyor 160. In other words, the seals 154 prevent the sublimated source material from "leaking out" through the longitudinal ends of the apparatus 100. It should be appreciated that the seals 154 may be defined by any suitable structure. In the illustrated embodiment, the seals 154 are actually defined by components of the lower shell member 132 of the heated distribution manifold 124.

Any manner of longitudinally extending seal structure 155 may also be configured with the deposition head 110 to provide a seal along the longitudinal sides thereof. Referring to FIG. 3, this seal structure 155 may include a longitudinally extending side member that is disposed generally as close as reasonably possible to the upper surface of the underlying upper conveyor surface 163 so as to inhibit outward flow of the sublimated source material without frictionally engaging against the conveyor 160.

Referring still to FIG. 3, the illustrated embodiment of the deposition head 110 includes a movable shutter plate 136 disposed above the distribution manifold 124. This shutter plate 136 includes a plurality of passages 138 defined therethrough that align with the passages 126 in the distribution manifold 124 in a first operational position of the shutter plate 136 as depicted in FIG. 3. As can be readily appreciated from FIG. 3, in this operational position of the shutter plate 136, the sublimated source material is free to flow through the shutter plate 136 and through the passages 126 in the distribution manifold 124 for subsequent distribution through the plate 152. The shutter plate 136 is movable to a second operational position relative to the upper surface of the distribution manifold 124 wherein the passages 138 in the shutter plate 136 are misaligned with the passages 126 in the distribution manifold 124. In this configuration, the sublimated source material is blocked from passing through the distribution manifold 124, and is essentially contained within the interior volume of the head chamber 110. Any suitable actuation mechanism, generally 140, may be configured for moving the shutter plate 136 between the first and second operational positions. In the illustrated embodiment, the actuation mechanism 140 includes a rod 142 and any manner of suitable linkage that connects the rod 142 to the shutter plate 136. The rod 142 is rotated by any manner of mechanism located externally of the deposition head 110. The shutter plate 136 configuration illustrated in FIG. 3 is particularly beneficial in that the sublimated source material can be quickly and easily contained within the deposition head 110 and prevented from passing through to the deposition area above the transport conveyor 160. This may be desired, for example, during start up of the system 10 while the concentration of vapors within the head chamber builds to a sufficient degree to start the deposition process. Likewise, during shutdown of the system, it may be desired to maintain the sublimated source material within the deposition head 110 to prevent the material from condensing on the conveyor 160 or other components of the apparatus 100.

FIG. 5 illustrates a conveyor assembly 200 that may incorporate the transport conveyor 160 in accordance with one embodiment. The assembly 200 may include a housing 204 that defines an enclosed interior volume (at least around the sides and top) in which the conveyor 160 is contained. The conveyor 160 is driven in its endless loop within the housing 204 around sprockets 238. The housing 204 includes end walls 208, side walls, and a top member 210 that defines an open deposition area 212 through which the upper surface 163 of the conveyor 160 is exposed along the upper leg 162. This open deposition area 212 aligns with the deposition head 110, particularly the distribution plate 88, such that the upper surface 163 of the conveyor 160 is exposed to the distribution plate 88 in the open deposition area 212.

FIGS. 6 and 7 illustrate components of an endless loop conveyor that may be used as the transport conveyor 160 and the substrate conveyor 166, for example in the embodiment of FIG. 4. In this embodiment, the slats 230 each have a respective flat planar outer surface 232 and a transverse leading edge profile 235 and a transverse trailing edge profile 236. The trailing edge profile 236 is inclined or slanted with respect to vertical. The leading transverse edge profile 235 has a chamfered or double-angled profile and cooperates with the trailing edge 236 of an adjacent slat 230 so as to define a tortuous non-vertical path through the adjacent slats 230 along the upper leg 162 of the conveyor 160. This tortuous path inhibits sublimated source material from passing through the conveyor slats 230. Referring to FIG. 5, it can be seen that the adjacent slats 230 along the upper leg 162 define a flat, planar surface whereby the outer surfaces 232 of the slats lie in a common horizontal plane and define the uninterrupted flat upper surface 163 onto which the source material condenses as the conveyor 160 moves along the upper leg 162. In the embodiment wherein the conveyor is used as the substrate conveyor 166, the flat surface defined by the outer surfaces 232 of the slats 230 define a flat support surface for the substrates 14 conveyed through the assembly 100. This flat support surface prevents bowing of the glass substrates 14. In addition, the flat conveyor surface, in combination with the transverse edge profiles of the slats 230 discussed above, prevent back side coating of the substrates 14 with sublimated source material.

Referring again to the housing construction 204 depicted in FIG. 5, it can be seen that the open deposition area 212 in the top wall 210 has a transverse dimension (relative to the transport direction of the conveyor 160) that is less than the transverse length of the underlying slats 230. In essence, the open deposition area 212 defines a "picture frame" around a completely flat, planar surface 163 of the conveyor 160 in its upper leg 162 of travel. The sublimated source material plates onto the surface 163 within this picture frame, which is then transferred to the subsequent deposition location adjacent to the substrate conveyor along the lower leg 164. The source material is transferred to the upper surface of the substrates 14 in essentially the same picture frame dimensions. The flat surface 163 defined by the upper surfaces 232 of the slats 230 is "uninterrupted" in that at no location within the open deposition area 212 can a vertical line be drawn through the surface. As described above, even at the transverse edges 235, 236 of adjacent slats 230, the transverse edge profiles define a non-vertical tortuous path that inhibits sublimated source material from passing therethrough.

Referring to FIG. 5, the top wall 210 may include sealing surfaces 226 that are engaged by the seals 154 of the deposition head 110, as discussed above. This sealing arrangement ensures that the sublimated source material that passes through the distribution plate 88 is maintained in the open deposition area 212 of the top member 210 and does not escape at the interface of the conveyor assembly 200 and the deposition head 110. The open deposition area 212 may be defined so as to have dimensions that define the eventual surface area of the thin film layer of source material on the substrates. In other words, the surface area geometries of the thin film layer on the substrate can be controlled by defining the dimensions of the open deposition area 212 in the top member 210.

In a particular embodiment, the conveyor slats 230 are interconnected by link assemblies 240, as illustrated particularly in FIGS. 6 and 7. These link assemblies 240 may take on various configurations. In the illustrated embodiment, the link assemblies 240 include inner and outer link plates 246, 248. Rollers 242 are contained between the plates 246, 248 by respective axles 250. The axles 250 serve to interconnect adjacent inner and outer plates 246, 248 at the respective longitudinal ends thereof, and to also rotationally support the rollers 242 between the plates. Each of the inner and outer plates 246, 248 includes a tab 252 that extends through a slot in the slats 230. These tabs 252 have an undercut such that after insertion of the tabs 252 through the slots, the plates 246, 248 are shifted relative to the tabs slats 230 to ensure that the slats 230 cannot be pulled from the plates 246, 248.

Referring to FIG. 5, one end of the axles 250 has an enlarged head that prevents the axles from being pulled through the plates 246, 248. The opposite end of the axles 250 protrudes through the outer plates 248. A clip 256 attaches to the end of the axles 250, and extends between two axles. Thus, the clip 256 has a longitudinal length that is essentially the same as one of the plates 246, 248, and does not inhibit travel of the link assemblies 240 around the sprockets 238.

The present invention also encompasses various process embodiments for vapor deposition of a sublimated source material to form a thin film on a PV module substrate. The various processes may be practiced with the system embodiments described above or by any other configuration of suitable system components. It should thus be appreciated that the process embodiments according to the invention are not limited to the system configuration described herein.

In a particular embodiment, the vapor deposition process includes sublimating source material in a deposition head and condensing the sublimated source material onto a transfer device, such as a first conveyor that is disposed below the deposition head. The transfer device is moved to a position adjacent to a conveyor that carries substrates thereon. The source material on the transfer device is then sublimated and condensed (i.e., plates) onto the substrates. The transfer device may be a conveyor that is driven in an endless loop path between an upper leg and a lower leg, with the second conveyor moving in a conveyance path adjacent to the lower leg. The first conveyor and the second conveyor may move in the same direction along the lower leg of the first conveyor. In an alternate embodiment the conveyors may move in opposite directions along the lower leg of the first conveyor. The second conveyor may also move in an endless loop path.

The process may also include heating the first conveyor along the lower leg to sublimate the source material plated thereon. After the heating and sublimation, the process may also include cooling the first conveyor prior to the first conveyor moving to the upper leg.

The process includes maintaining a desired diffusion length along the lower leg between the first conveyor and an upper surface of a substrate carried by the second conveyor of between about 2 mm to about 50 mm.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. An apparatus for indirect vapor deposition of a sublimated source material as a thin film on a photovoltaic module substrate, said apparatus comprising:
   a deposition head configured for sublimating a source material supplied thereto;
   a transfer conveyor disposed below said deposition head onto which the sublimated source material plates, wherein said transport conveyor is movable in an endless loop between an upper leg and a lower leg, said transport conveyor comprises a plurality of interconnected slats;
   a substrate conveyor configured to convey substrates in a conveyance path through said apparatus;
   said transfer conveyor movable to a position opposite to an upper surface of the substrates; and,
   a heat source configured adjacent to said transfer conveyor;
   wherein source material initially plated onto said transport conveyor is sublimated and transferred to the upper surface of substrates conveyed by said substrate conveyor.

2. The apparatus as in claim 1, wherein said transport conveyor comprises an upper surface onto which the sublimated source material plates as said transport conveyor moves in said upper leg, said substrate conveyor disposed below said lower leg, and said heat source configured adjacent said lower leg.

3. The apparatus as in claim 2, wherein said substrate conveyor moves in a direction opposite to said transport conveyor along said lower leg.

4. The apparatus as in claim 2, wherein said substrate conveyor moves in the same direction as said transport conveyor along said lower leg.

5. The apparatus as in claim 4, said transport conveyor further comprising a top member, said top member defining an open deposition area in said upper leg within which the source material plates onto said transport conveyor, said top member further defining a seal surface for said deposition head.

6. The apparatus as in claim 2, wherein each of said slats has a respective flat planar outer surface and transverse edge profiles such that, in said upper leg, said outer surfaces of said slats lie in a common horizontal plane and define an uninterrupted flat deposition surface presented to said deposition head.

7. The apparatus as in claim 2, wherein said substrate conveyor is configured directly opposite said lower leg of said transfer conveyor without intervening structure between the upper surface of a substrate carried by said substrate conveyor and said lower leg of said transport conveyor.

8. The apparatus as in claim 7, wherein a diffusion length for sublimated source material from said lower leg of said transport conveyor to the upper surface of the substrates is from about 2 mm to about 50 mm.

9. The apparatus as in claim 1, wherein said substrate conveyor comprises a roller conveyor.

10. The apparatus as in claim 1, wherein said substrate conveyor comprises an endless loop conveyor having an upper leg that defines said conveyance path.

11. The apparatus as in claim 10, wherein said endless loop conveyor comprises a plurality of interconnected slats, each of said slats having a respective flat planar outer surface and transverse edge profiles such that said outer surfaces of said slats lie in a common horizontal plane in said upper leg and define an uninterrupted flat support surface for said substrates.

* * * * *